United States Patent
Wang (10) Patent No.: US 12,035,606 B2
(45) Date of Patent: Jul. 9, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Haoran Wang, Wuhan (CN)

(*) Notice: Subject to any disclaimer, the term of this patent is extended or adjusted under 35 U.S.C. 154(b) by 0 days.

(21) Appl. No.: 17/599,588

(22) PCT Filed: Sep. 15, 2021

(86) PCT No.: PCT/CN2021/118394
§ 371 (c)(1),
(2) Date: Sep. 29, 2021

(87) PCT Pub. No.: WO2023/029092
PCT Pub. Date: Mar. 9, 2023

(65) Prior Publication Data
US 2024/0032399 A1 Jan. 25, 2024

(30) Foreign Application Priority Data
Sep. 3, 2021 (CN) .......................... 202111029964.5

(51) Int. Cl.
*H10K 59/80* (2023.01)

(52) U.S. Cl.
CPC ......... *H10K 59/879* (2023.02); *H10K 59/873* (2023.02)

(58) Field of Classification Search
None
See application file for complete search history.

(56) References Cited

U.S. PATENT DOCUMENTS

2020/0083484 A1* 3/2020 Lee .................. H10K 59/122

FOREIGN PATENT DOCUMENTS

| CN | 106159105 A | 11/2016 |
| CN | 106405853 A | 2/2017 |
| CN | 209607764 U | 11/2019 |
| CN | 110854298 A | 2/2020 |
| CN | 111769143 A | 10/2020 |
| CN | 111834544 A | 10/2020 |
| CN | 113241354 A | 8/2021 |
| JP | H7142170 A | 6/1995 |

OTHER PUBLICATIONS

International Search Report in International application No. PCT/CN2021/118394, dated May 5, 2022.
Written Opinion of the International Search Authority in International application No. PCT/CN2021/118394, dated May 5, 2022.

* cited by examiner

*Primary Examiner* — Daniel Whalen (57) ABSTRACT

A display panel and a display device are provided. The display panel has an array substrate, a plurality of light-emitting pixel units, a micro lens layer, and a passivation layer. The micro lens layer has a plurality of micro lenses and a plurality of openings. The plurality of openings have a plurality of first openings. In a direction along a plane of the display panel, each of the first openings has a main body portion and at least one expansion portion. The expansion portion is provided at a corner of the main body portion, and the expansion portion is an arc-shaped convex surface, which is beneficial to improve a light concentration effect of micro lenses.

20 Claims, 9 Drawing Sheets

DISPLAY PANEL AND DISPLAY DEVICE

FIELD OF DISCLOSURE

The present disclosure relates to displays, and more particularly to a display panel and a display device.

BACKGROUND OF DISCLOSURE

For an organic light-emitting diode (OLED) display panel, in order to improve a luminous efficiency of the light-emitting device, reduce power consumption and extend a life span, a micro lens structure is used for light extraction. The micro lens structure includes a plurality of micro lenses, and the micro lenses are usually prepared by using a mask with a photolithography pattern. However, an ultraviolet light diffracted into the mask will be stronger when superimposed at corners of a photolithography pattern. As a result, an etched taper angle is greatly reduced and extends inward, which affects a light convergence effect of the micro lens structure.

SUMMARY OF DISCLOSURE

An embodiment of the present application provides a display panel and a display device, so as to solve a technical problem that when the micro lens layer of an existing display panel is used, a taper angle that is etched is greatly reduced and extends inward, which affects a light convergence effect of the micro lens structure.

In order to solve the above problems, technical solutions provided by this application are as follows:

The present application provides a display panel comprising:
  an array substrate;
  a plurality of light-emitting pixel units arranged on the array substrate;
  a micro lens layer arranged on a side of the light-emitting pixel units away from the array substrate, wherein the micro lens layer comprises a plurality of micro lenses and a plurality of openings, the openings are formed between two adjacent micro lenses, and the openings are arranged corresponding to the light-emitting pixel units; a passivation layer covering the micro lens layer, wherein a refractive index of the passivation layer is greater than a refractive index of the micro lens layer; and
  an encapsulation layer covering the light-emitting pixel units and the array substrate,
  wherein the plurality of openings include a plurality of first openings, and in a direction along a plane of the display panel, each of the first openings includes a main body portion and at least one expansion portion, wherein the main body portion includes a plurality of side edges, and a corner is formed at the intersection of two adjacent side edges, wherein the expansion portion is arranged at the corner, and the expansion portion is an arc-shaped convex surface.

According to a display panel provided by the present application, the plurality of side edges include a plurality of first sides and a plurality of second sides, and the first sides and two adjacent second sides respectively form a first corner and a second corner, wherein the expansion portion is provided at the first corner and the second corner.

According to a display panel provided by the present application, the expansion portion surrounds the first corner and the second corner.

According to a display panel provided by the present application, the expansion portion is located between two adjacent extension lines of the first side, and a circle where the expansion portion is located is circumscribed to a circle where the two adjacent first sides are located, respectively.

According to a display panel provided by the present application, the expansion portion at least comprises a first sub-expansion portion and a second sub-expansion portion connected with each other, wherein the first sub-expansion portion surrounds the first corner, and the second sub-expansion portion surrounds the second corner.

According to a display panel provided by the present application, a ratio of an area of the expansion portion to an area of the main body portion is less than or equal to 0.2.

According to a display panel provided by the present application, an angle between a side surface of the micro lenses and a plane where the array substrate is located is in a range of 50 degrees to 90 degrees.

The present application provides a display panel comprising:
  an array substrate;
  a plurality of light-emitting pixel units arranged on the array substrate;
  a micro lens layer arranged on a side of the light-emitting pixel units away from the array substrate, wherein the micro lens layer comprises a plurality of micro lenses and a plurality of openings, the openings are formed between two adjacent micro lenses, and the openings are arranged corresponding to the light-emitting pixel units; and
  a passivation layer covering the micro lens layer, wherein a refractive index of the passivation layer is greater than a refractive index of the micro lens layer,
  wherein the plurality of openings include a plurality of first openings, and in a direction along a plane of the display panel, each of the first openings includes a main body portion and at least one expansion portion, wherein the main body portion includes a plurality of side edges, and a corner is formed at the intersection of two adjacent side edges, wherein the expansion portion is arranged at the corner, and the expansion portion is an arc-shaped convex surface.

According to a display panel provided by the present application, the plurality of side edges include a plurality of first sides and a plurality of second sides, and the first sides and two adjacent second sides respectively form a first corner and a second corner, wherein the expansion portion is provided at the first corner and the second corner.

According to a display panel provided by the present application, the expansion portion surrounds the first corner and the second corner.

According to a display panel provided by the present application, the expansion portion is located between two adjacent extension lines of the first side, and a circle where the expansion portion is located is circumscribed to a circle where the two adjacent first sides are located, respectively.

According to a display panel provided by the present application, the expansion portion at least comprises a first sub-expansion portion and a second sub-expansion portion connected with each other, wherein the first sub-expansion portion surrounds the first corner, and the second sub-expansion portion surrounds the second corner.

According to a display panel provided by the present application, a ratio of an area of the expansion portion to an area of the main body portion is less than or equal to 0.2.

According to a display panel provided by the present application, an angle between a side surface of the micro lenses and a plane where the array substrate is located is in a range of 50 degrees to 90 degrees.

According to a display panel provided by the present application, on a cross-section perpendicular to the two opposite first sides, an angle between the side surface of the micro lenses and the plane where the array substrate is located is a first angle; wherein on a cross-section perpendicular to the two opposite expansion portions, an angle between the side surface of the micro lenses and the plane where the array substrate is located is a second angle; and wherein, a range of a difference between the first angle and the second angle is less than 20 degrees.

According to a display panel provided by the present application, the first angle and the second angle are equal.

According to a display panel provided by the present application, the plurality of side edges include four first sides and four second sides, wherein the four first sides and the four second sides are alternately connected to form a closed figure, and the first sides are arc lines recessed toward an inside of the closed figure.

According to a display panel provided by the present application, a planar shape of the main body portion is the same as a planar shape of corresponding light-emitting pixel units.

According to a display panel provided by the present application, the openings further comprise a second opening, and a planar shape of the second opening is an ellipse or a circle; and the plurality of light-emitting pixel units at least include a red light-emitting pixel unit, a green light-emitting pixel unit, and a blue light-emitting pixel unit, wherein the first openings correspond to the red light-emitting pixel unit and the green light-emitting pixel unit, and the second opening corresponds to the blue light-emitting pixel unit.

The present application provides a display device including the above-mentioned display panel.

Beneficial effects of the present application are that: in the display panel and the display device provided in the present application, the display panel includes a micro lens layer and a passivation layer, the micro lens layer includes a plurality of micro lenses and a plurality of openings, and the plurality of openings includes a plurality of first openings, where each of the first openings includes a main body. In the present application, by setting an expansion portion at the corner to fine-tune a shape of the first opening based on a pattern of the main body portion. In one aspect, the first openings are made to be close to the light-emitting pixel unit in shape, so as to avoid reducing a light condensing effect of the micro lenses due to a large difference between the shape of the first openings and the light-emitting pixel units. In another aspect, forming a flared portion at the corner of the main body portion increases a distance between adjacent side edges, which can reduce a superimposed intensity of a diffracted light diffused into a mask at the corner, thereby improving the taper angle of the micro lenses. It is beneficial to improve a light condensing effect of the micro lenses, thereby improving a luminous efficiency of the display panel.

DESCRIPTION OF DRAWINGS

In order to more clearly describe the technical solutions in the embodiments of the present application, the following will briefly introduce the drawings that need to be used in the description of the embodiments. Obviously, the drawings in the following description are only some embodiments of the present application. For those skilled in the art, without creative work, other drawings can be obtained based on these drawings.

DESCRIPTION OF REFERENCE SIGNS

1. Display panel; 11, array substrate; 12, light-emitting pixel unit; 121, red light-emitting pixel unit; 122, green light-emitting pixel unit; 123, blue light-emitting pixel unit; 13, encapsulation layer; 14, micro lens layer; 141, micro lens; 142, first opening; 143, second opening; 15, passivation layer; 16, photoresist layer;
2. mask plate; 21, first functional area; 22, second functional area; 23, hollow area; 24, shading area; 211, main body portion; 2111, side edge; 2111a, first side; 2111b, second side; 2112, corner; 2112a, first corner; 2112b, second corner; 212, expansion portion; 212a, first sub-expansion portion; 212b, second sub-expansion portion.

DETAILED DESCRIPTION OF PREFERRED EMBODIMENTS

The technical solutions in the embodiments of the present application will be clearly and completely described below in conjunction with the accompanying drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application. In addition, it should be understood that the specific implementations described here are only used to illustrate and explain the application, and are not used to limit the application. In this application, if no explanation is made to the contrary, the orientation words used such as "upper" and "lower" generally refer to the upper and lower positions of the device in actual use or working state, and specifically refer to the drawing directions in the drawings. Further, "inner" and "outer" refer to the outline of the device.

Figure 1:
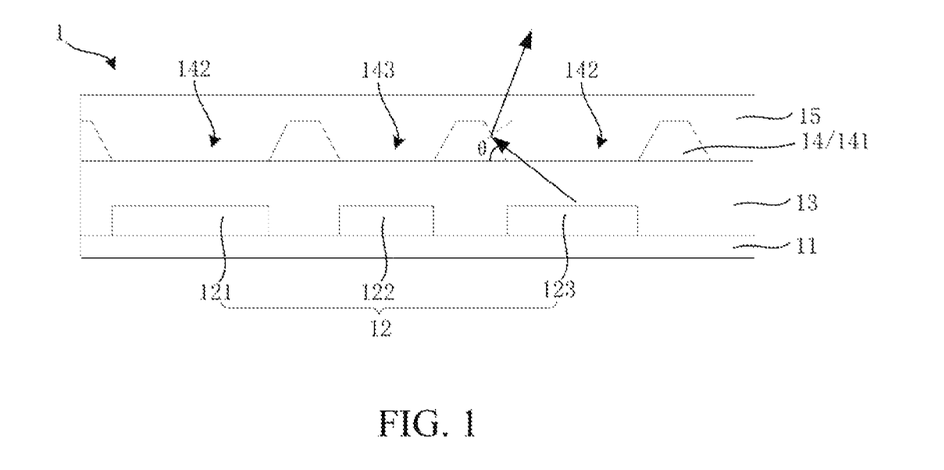
FIG. 1 is a schematic diagram of a cross-sectional structure of a display panel provided by an embodiment of the present application.

Please refer to FIG. 1. FIG. 1 is a schematic cross-sectional structure diagram of a display panel provided by an embodiment of the present disclosure. An embodiment of the present disclosure provides a display panel 1, which includes an array substrate 11, a plurality of light-emitting pixel units 12, a micro lens layer 14, and a passivation layer 15.

The array substrate 11 includes a substrate and a plurality of thin film transistors and a plurality of signal wirings provided on the substrate. The thin film transistors are used to drive the corresponding light-emitting pixel units 12 to emit light. A plurality of the light-emitting pixel units 12 are arranged on the array substrate 11. The micro lens layer 14 is provided on a side of the light-emitting pixel unit 12 away from the array substrate 11. The micro lens layer 14 includes a plurality of micro lenses 141 and a plurality of openings. Each of the openings are formed between two adjacent micro lenses 141. The openings are arranged corresponding to the light-emitting pixel units 12. The passivation layer 15 covers the micro lens layer 14.

Understandably, the display panel 1 in the embodiment of the present disclosure passes through the difference in refractive index between the micro lens layer 14 and the passivation layer 15. In this way, a light emitted by the light-emitting pixel units 12 is totally reflected at the junction of the micro lenses 141 and the passivation layer 15, so that the light is converged. Specifically, a refractive index of the passivation layer 15 is greater than the refractive index of the micro lens layer 14. For example, a refractive index of the micro lens layer 14 is 1.5, and the refractive index of the passivation layer 15 is 1.65. When a planar shape of the opening and a planar shape of the light-emitting pixel units 12 are the same and the size is the same or close to each other, the light emitted by the light-emitting pixel units 12 has the best converging effect at a junction of the micro lenses 141 and the passivation layer 15.

Since a pattern shape of the light-emitting pixel unit 12 has corners, correspondingly, the pattern shape of a mask used to form the opening also has corners, and the corners are formed by an intersection of two adjacent side edges. Since an ultraviolet light used in an exposure process will be diffracted at the two adjacent side edges forming the corners, the ultraviolet light bypasses the edges of the two adjacent side edges and spreads to different degrees. Because a relative distance between the two adjacent side edges at the corners is relatively short, the ultraviolet light diffracted from the two adjacent side edges into the mask is superimposed at the corner, resulting in greater intensity of the diffracted light. As a result, the taper angle θ of the etched micro lenses 141 is low and extends inward, which affects the light convergence effect of the micro lenses 141.

Figure 2A:
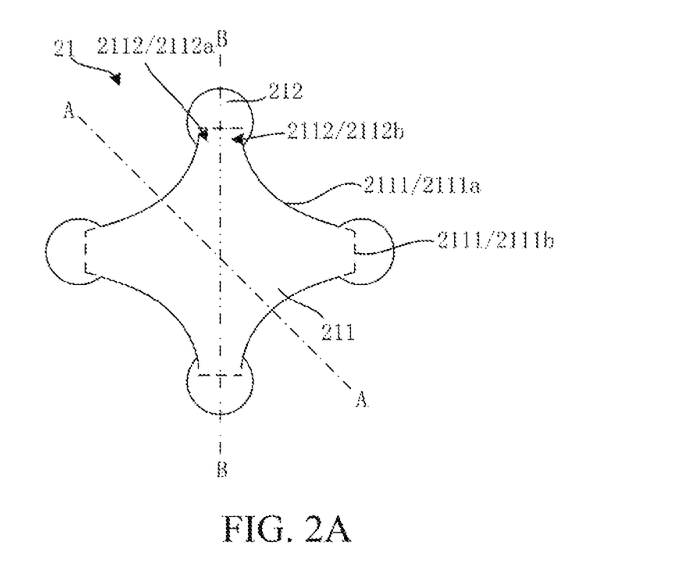
FIG. 2A is a schematic view of a first planar structure of first openings of the display panel in FIG. 1.
Figure 2B:
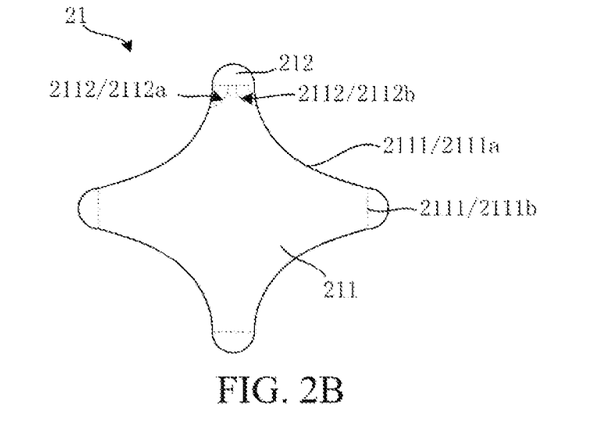
FIG. 2B is a schematic view of a second planar structure of first openings of the display panel in FIG. 1.
Figure 2C:
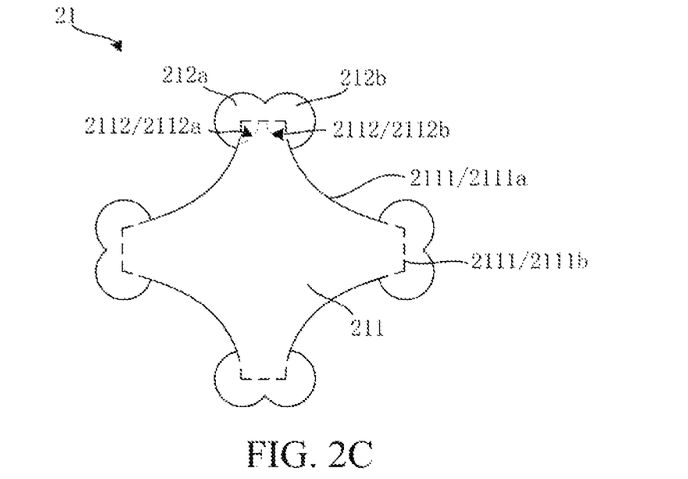
FIG. 2C is a schematic view of a third planar structure of first openings of the display panel in FIG. 1.

In view of this, please combine FIG. 1 and FIG. 2A-FIG. 2C. FIG. 2A is a schematic diagram of a first planar structure of a first opening of the display panel in FIG. 1. FIG. 2B is a schematic diagram of a second planar structure of a first opening of the display panel in FIG. 1. FIG. 2C is a schematic diagram of a third planar structure of a first opening of the display panel in FIG. 1.

The plurality of openings includes a plurality of first openings 142. In a direction along a plane of the display panel 1, each of the first openings 142 includes a main body portion 211 and at least one expansion portion 212. A planar shape of the main body portion 211 is the same as a planar shape of a corresponding light-emitting pixel unit 12. The main body portion 211 includes a plurality of side edges 2111. A corner 2112 is formed at the intersection of two adjacent side edges 2111. The expansion portion 212 is provided at the corner 2112. The expansion portion 212 is an arc-shaped convex surface.

It can be understood that, in the present disclosure, the expansion portion 212 is provided at the corner 2112 to perform fine adjustment based on the pattern of the main body portion 211. In one aspect, the first openings 142 are close to the light-emitting pixel units 12 in shape, so as to avoid reducing the light condensing effect of the micro lenses 141 due to a large difference between a shape of the first openings 142 and the light-emitting pixel units 12. In another aspect, the expansion portion 212 increases the distance between two adjacent side edges 2111. This can reduce a total amount of light superimposed at the corner 2112 of the ultraviolet light diffracted into the mask 2 by the two adjacent side edges 2111. Therefore, a superimposed intensity of the diffracted light diffused into the mask 2 at the corner 2112 is reduced, and the taper angle θ of the micro lenses 141 is increased. It is beneficial to improve the light condensing effect of the micro lenses 141, thereby improving the luminous efficiency of the display panel 1.

Specifically, the plurality of side edges 2111 includes a plurality of first sides 2111a and a plurality of second sides 2111b. The first sides 2111a and two adjacent second sides 2111b respectively form a first corner 2112a and a second corner 2112b. The expansion portion 212 is provided at the first corner 2112a and the second corner 2112b.

In an embodiment, referring to FIG. 2A, the expansion portion 212 surrounds the first corner 2112a and the second corner 2112b. Since a size of the second side 2111b is shorter than that of the first side 2111a, a distance between the first corner 2112a and the second corner 2112b is shorter. Therefore, in this embodiment, by providing only one expansion portion 212 that simultaneously surrounds the first corner 2112a and the second corner 2112b. A circle where the expansion portion 212 is located intersect with a circle where the two adjacent second sides 2111b are located, respectively.

It should be noted, the term of "surround" in this embodiment means that a ray formed by taking a vertex of the first corner 2112a as an end point and extending in any direction away from the main body portion 211 passes through the expansion portion 212, and a ray formed by using a vertex of the second corner 2112b as an end point to extend in any direction away from the main body 211 also pass through the outer expansion portion 212.

In an embodiment, please refer to FIG. 2B. A difference between FIG. 2B and FIG. 2A is that: the expansion portion 212 is located between the extension lines of the two adjacent first sides 2111a, and a circle where the expansion portion 212 is located is circumscribed to a circle where the two adjacent first sides 2111a are located respectively. An area of the expansion portion 212 in FIG. 2A is smaller than an area of the expansion portion 212 in FIG. 2B, which is beneficial to reduce the difference between the formed first openings 142 and the corresponding light-emitting pixel units 12, Therefore, the light condensing effect of the micro lenses 141 is further improved.

In an embodiment, please refer to FIG. 2C. A difference between FIG. 2C and FIG. 2A is that: the expansion portion 212 includes a first sub-expansion portion 212a and a second sub-expansion portion 212b connected with each other, wherein the first sub-expansion portion 212a surrounds the first corner 2112a, and the second sub-expansion portion 212b surrounds the second corner 2112b. In this embodiment, by arranging two sub-expansion portions surrounding the first corner 2112a and the second corner 2112b respectively, a circle where the first sub-expansion portion 212a is located intersects a circle where one of the two adjacent first sides 2111a is located, and a circle where the second sub-expansion portion 212b is located intersects a circle where the other one of the two adjacent first sides 2111a is located.

It should be noted, the term of "surround" in this embodiment means that a ray formed by taking a vertex of the first corner 2112a as an end point to extend in any direction away from the main body portion 211 passes through the first sub-expansion portion 212a, and a ray formed by taking a vertex of the second corner 2112b as an end point and extending in any direction away from the main body portion 211 passes through the second sub-expansion portion 212b. In a direction along the plane of the mask plate 2, a sum of areas of the first sub-expansion portion 212a and the second sub-expansion portion 212b in FIG. 2C is smaller than that of the expansion portion in FIG. 2A. It is beneficial to reduce the difference between the formed first openings 142 and the corresponding light-emitting pixel units 12, thereby further improving the light condensing effect of the micro lenses 141.

Specifically, in order to avoid that the first openings 142 are too different from the corresponding light-emitting pixel units 12, the light condensing effect of the micro lenses 141 is affected. In the embodiment of the present disclosure, a ratio of the area of the expansion portion 212 to the area of the main body portion 211 is less than or equal to 0.2.

Specifically, in a plane direction perpendicular to the display panel 1, an angle between a side surface of the micro lenses 141 and a plane where the array substrate 11 is located ranges from 50 degrees to 90 degrees.

Figure 3A:
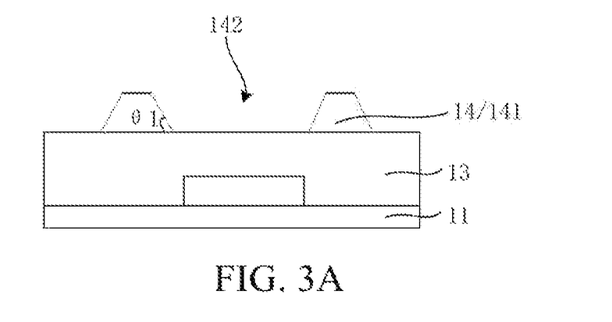
FIG. 3A is a cross-sectional view taken along line A-A in FIG. 2A.
Figure 3B:
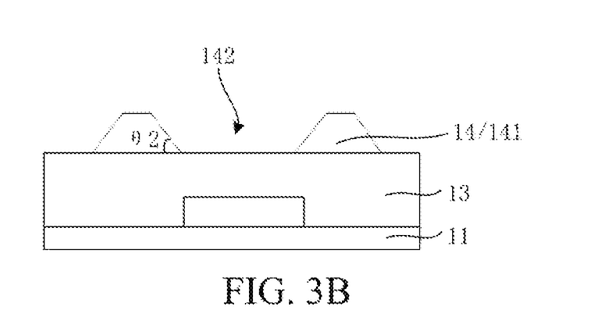
FIG. 3B is a cross-sectional view taken along line B-B in FIG. 2A.

Further, please refer to FIGS. 3A and 3B. FIG. 3A is a cross-sectional view along A-A in FIG. 2A. FIG. 3B is a cross-sectional view along B-B in FIG. 2A. On a cross section perpendicular to the two opposite first sides 2111a (along the A-A section line in FIG. 2A), an angle between the side surface of the micro lenses 141 and a plane where the array substrate 11 is located is the first Angle 81. On a cross section perpendicular to the two opposite expansion portions 212 (along the B-B section line in FIG. 2A), an angle between the side surface of the micro lenses 141 and a plane where the array substrate 11 is located is a second angle 82.

A range of the difference between the first angle 81 and the second angle 82 is less than 20 degrees. By adding a design of the expansion portion 212 to the main body portion 211, the inward extension of the micro lenses 141 can be improved, such that the second angle 82 decreases and approaches the first angle 81. It is beneficial to improve the light condensing effect of the micro lenses 141, thereby improving the luminous efficiency of the display panel 1.

Further, the first angle 81 is equal to the second angle 82. In the present disclosure, by adding a design of the expansion portion 212 to the main body portion 211, the inward extension of the micro lenses 141 caused by the diffraction of light can be improved. It is beneficial to further improve the light condensing effect of the micro lenses 141, thereby improving the luminous efficiency of the display panel 1.

Optionally, in the embodiment of the present disclosure, the shape of the main body 211 is a pearl shape. Of course, in other embodiments, the main body 211 may also have other shapes, which is not limited in the present disclosure.

It should be noted that, in order to clearly illustrate the technical solution of the present disclosure, the embodiment of the present disclosure takes the shape of the main body portion 211 as a pearl as an example for explanation.

Specifically, the plurality of side edges 2111 includes four first sides 2111a and four second sides 2111b. The first side 2111a and the second side 2111b are alternately connected to form a closed figure. The first side 2111a is an arc that is recessed toward the inside of the closed figure. The second side 2111b is a straight line.

Figure 4A:
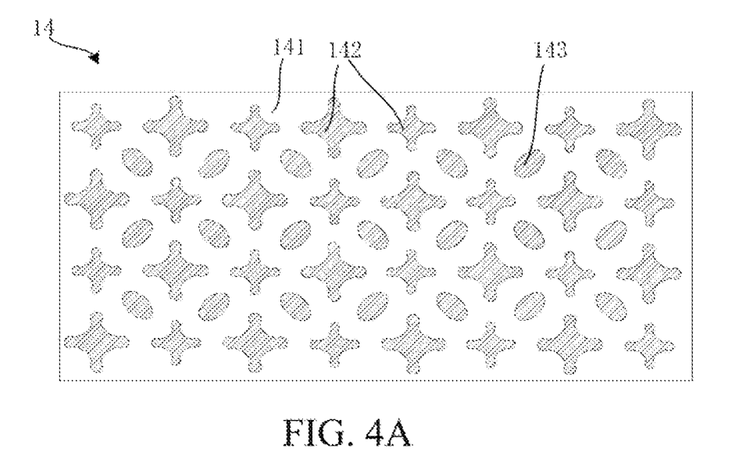
FIG. 4A is a schematic diagram of a planar structure of a micro lens layer of a display panel provided by an embodiment of the present application.
Figure 4B:
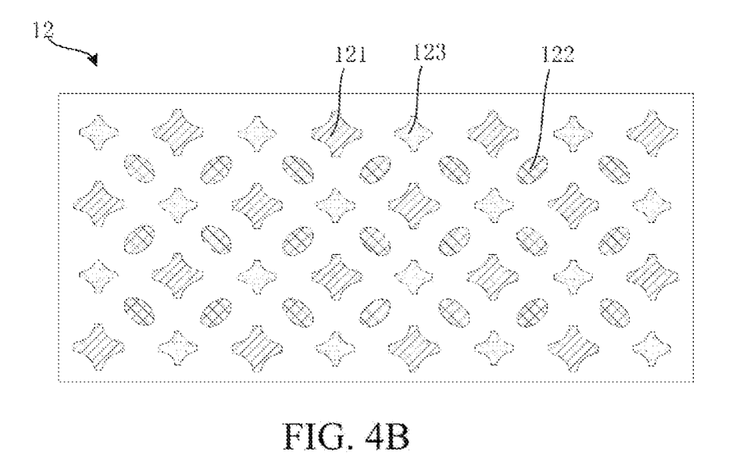
FIG. 4B is a schematic diagram of an arrangement of light-emitting pixel units provided by an embodiment of the present application.

Please combine FIG. 1, FIG. 4A, and FIG. 4B. FIG. 4A is a schematic diagram of a planar structure of a micro lens layer of a display panel according to an embodiment of the present disclosure. FIG. 4B is a schematic diagram of the arrangement of light-emitting pixel units provided by an embodiment of the present disclosure. The plurality of light-emitting pixel units 12 at least includes a plurality of red light-emitting pixel units 121, a plurality of green light-emitting pixel units 122, and a plurality of blue light-emitting pixel units 123. The first openings 142 correspond to the red light-emitting pixel unit 121 and the blue light-emitting pixel unit 123.

The planar shape of the main body portion 211 is the same as the planar shape of the corresponding light-emitting pixel unit 12. Correspondingly, in the embodiment of the present disclosure, the planar shape of the red light-emitting pixel unit 121 and the blue light-emitting pixel unit 123 is a pearl shape, and the planar shape of the green light-emitting pixel unit 122 may be an ellipse. Of course, the planar shape of the green light-emitting pixel unit 122 may also be other curved shapes.

Specifically, the light-emitting area of the red light-emitting pixel unit 121 is larger than the light-emitting area of the green light-emitting pixel unit 122. Therefore, in a plane direction of the display panel 1, the area of the first opening 142 corresponding to the red light-emitting pixel unit 121 is larger than the area of the first opening 142 corresponding to the green light-emitting pixel unit 122.

Further, the display panel 1 further includes a plurality of second openings 143. The second opening 143 is arranged corresponding to the green light-emitting pixel unit 122. The pattern shape of the second opening 143 is the same as the pattern shape of the green light-emitting pixel unit 122. The light-emitting area of the green light-emitting pixel unit 122 is smaller than the light-emitting area of the red light-emitting pixel unit 121 and the blue light-emitting pixel unit 123. Therefore, in the plane direction of the display panel 1, the area of the second opening 143 is smaller than the area of the first opening 142.

It is understandable that, the shape of the second opening 143 in the embodiment of the present disclosure is arc-shaped, there is no corner 2112 of the main body portion 211 in the first opening 142. Therefore, the second opening 143 does not need to be provided with the expansion portion 212.

Further, please continue to refer to FIG. 1. The display panel 1 further includes an encapsulation layer 13 arranged between the light-emitting pixel unit 12 and the micro lens layer 14. The encapsulation layer 13 covers the light-emitting pixel units 12 and the array substrate 11. The micro lens layer 14 is provided on a side of the encapsulation layer 13 away from the array substrate 11.

Further, the display panel 1 may also include portions not shown, such as touch electrodes, a buffer layer, and a color filter layer.

Figure 5:
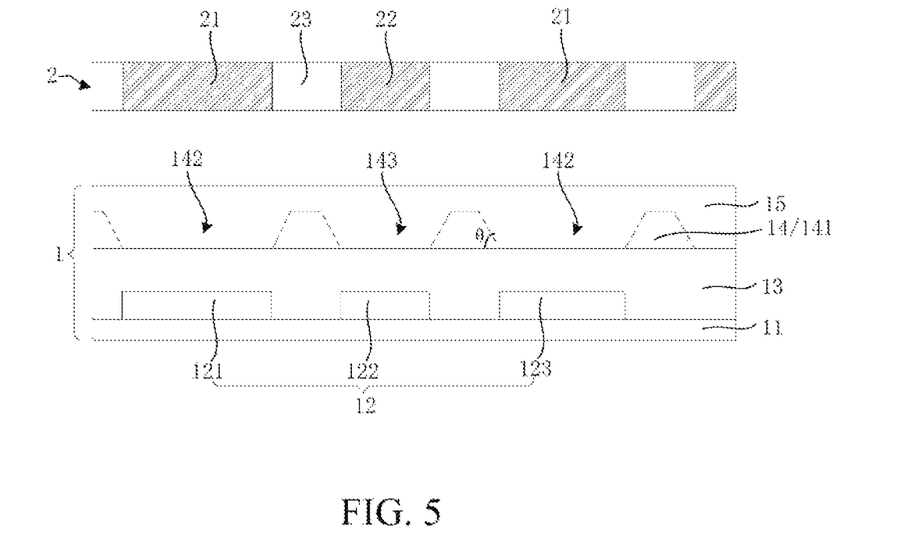
FIG. 5 is a schematic diagram of a corresponding structure of a first mask and a display panel provided by an embodiment of the present application.
Figure 6:
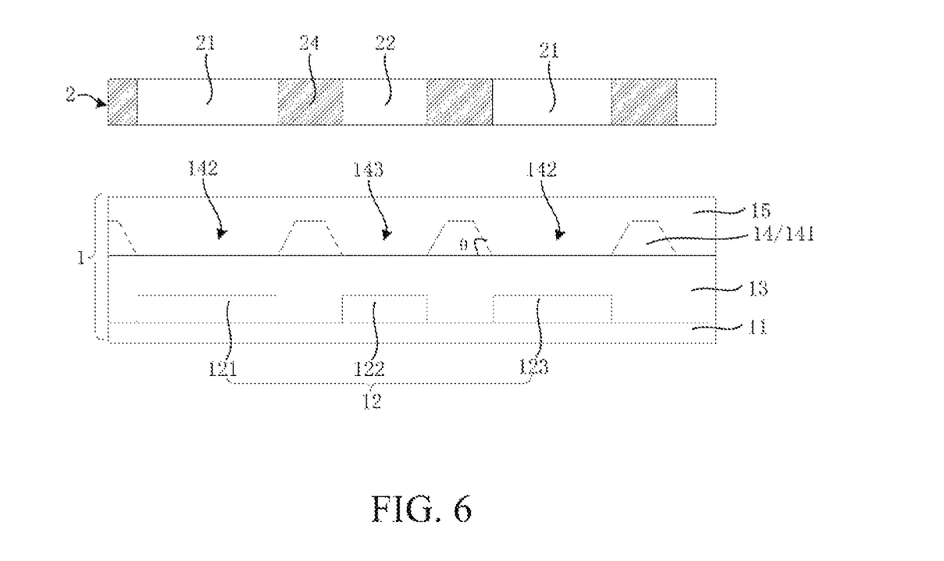
FIG. 6 is a schematic diagram of a corresponding structure of a second mask and a display panel provided by an embodiment of the present application.

Please refer to FIG. 5 and FIG. 6. FIG. 5 is a schematic diagram of the corresponding structure of a first mask and a display panel provided by an embodiment of the present disclosure. FIG. 6 is a schematic diagram of the corresponding structure of a second mask and a display panel provided by an embodiment of the present disclosure. The embodiment of the present disclosure also provides a mask for forming the opening. The mask includes a first functional area 21 and a second functional area 22. The first functional area 21 corresponds to the first opening 142. The second functional area corresponds to the second opening 143. A planar shape of the first functional area 21 is the same as the planar shape of the first opening 142. A planar shape of the second functional area 22 is the same as the planar shape of the second opening.

In an embodiment, referring to FIG. 5, the first functional area 21 and the second functional area 22 are light-shielding areas for light-shielding. An area on the mask 2 except for the first functional area 21 and the second functional area 22 is a hollow area 23 for light transmission. The photoresist used in a yellow light process for forming the micro lenses 141 is a negative photoresist, so that the ultraviolet light used for the exposure process passes through the hollow area 23 except for the first functional area 21 and the second functional area 22. The photoresist corresponding to the hollow area 23 remains, while the photoresist corresponding to the first functional area 21 and the second functional area 22 is removed. After an etching process, the micro lens layer 14 corresponding to the hollow area 23 is partially retained, and the micro lens layer 14 corresponding to the first functional area 21 and the second functional area 22 is completely removed. At the same time, due to the diffraction effect of light, the micro lens layer 14 near the edges corresponding to the first functional area 21 and the second functional area 22 is partially removed, thereby forming a taper angle θ.

In one embodiment, please refer to FIG. 6. The first functional area 21 and the second functional area 22 are hollow areas for light transmission. The area on the mask 2 except for the first functional area 21 and the second functional area 22 is a light-shielding area 24 for light-shielding. The photoresist used in the yellow light process for forming the micro lenses 141 is a positive photoresist, such that the ultraviolet light used for the exposure process passes through the light-shielding area 24 except for the first functional area 21 and the second functional area 22. The photoresist corresponding to the light-shielding area 24 is removed, while the photoresist corresponding to the first functional area 21 and the second functional area 22 remains. After an etching process, the micro lens layer 14 corresponding to the shading area 24 is completely removed, and the micro lens layer 14 corresponding to the first functional area 21 and the second functional area 22 remains. At the same time, due to the diffraction effect of light, a portion of the micro lens layer 14 near the edge of the light shielding region 24 remains, thereby forming a taper angle θ.

Figure 7:
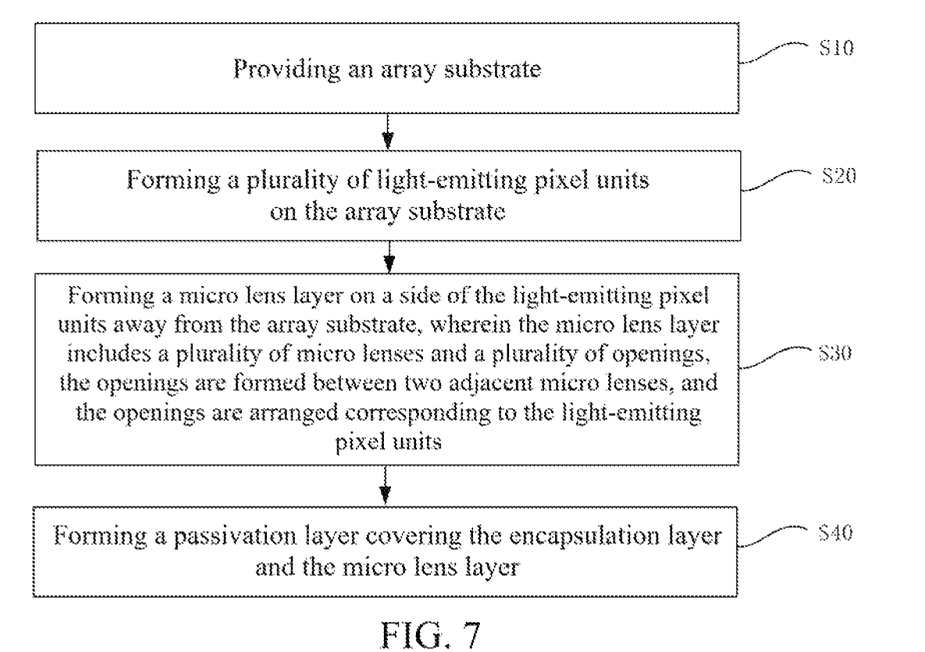
FIG. 7 is a flowchart of a manufacturing method of a display panel provided by an embodiment of the present application.

Please refer to FIG. 7, and FIG. 8A to FIG. 8G. FIG. 7 is a flowchart of a method for manufacturing a display panel provided by an embodiment of the present disclosure. FIG. 8A to FIG. 8G are schematic flowcharts of a manufacturing method of a display panel provided by an embodiment of the present disclosure. The embodiment of the present disclosure also provides a manufacturing method of the display panel 1, including the following steps:

In step S10, an array substrate 11 is provided.

Figure 8A:
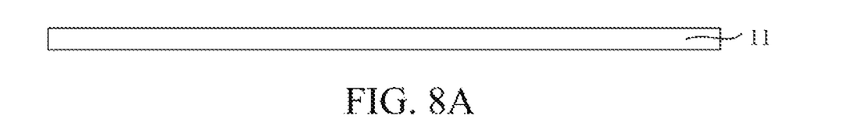
FIG. 8A to FIG. 8G are schematic flowcharts of a method for manufacturing a display panel provided by an embodiment of the present application.

Specifically, please refer to FIG. 8A. At first, a substrate is provided. A plurality of thin film transistors and a plurality of signal traces are formed on the substrate. The thin film transistor includes a gate, a gate insulating layer, an active layer, a source and drain metal layer, and other film layers, all of which are sequentially formed on the substrate. Since this is a prior art, it will not be described in detail here.

In step S20, a plurality of light-emitting pixel units 12 are formed on the array substrate 11.

Figure 8B:
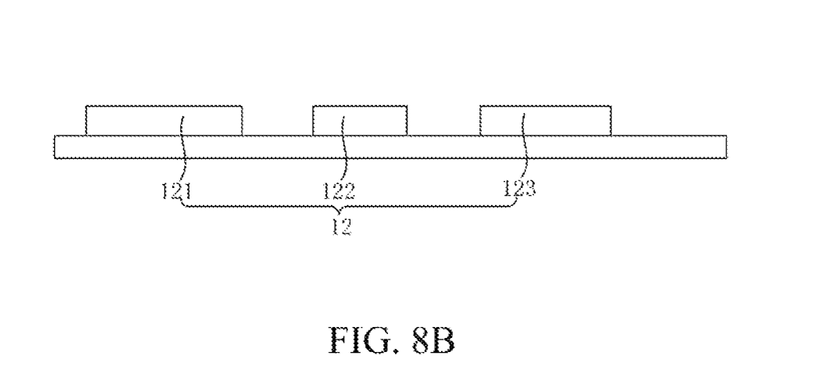

Specifically, please refer to FIG. 8B. The plurality of light-emitting pixel units 12 includes a red light-emitting pixel unit 121, a green light-emitting pixel unit 122, and a blue light-emitting pixel unit 123. Each of the light-emitting pixel units 12 includes an anode, a pixel definition layer, an electron injection layer, an electron transport layer, an organic light-emitting layer, a hole injection layer, and a hole transport layer. The organic light-emitting layer can be formed by inkjet printing.

Further, after the step S20, the method further includes: forming an encapsulation layer 13 covering the array substrate 11 and the light-emitting pixel unit 12.

Figure 8C:
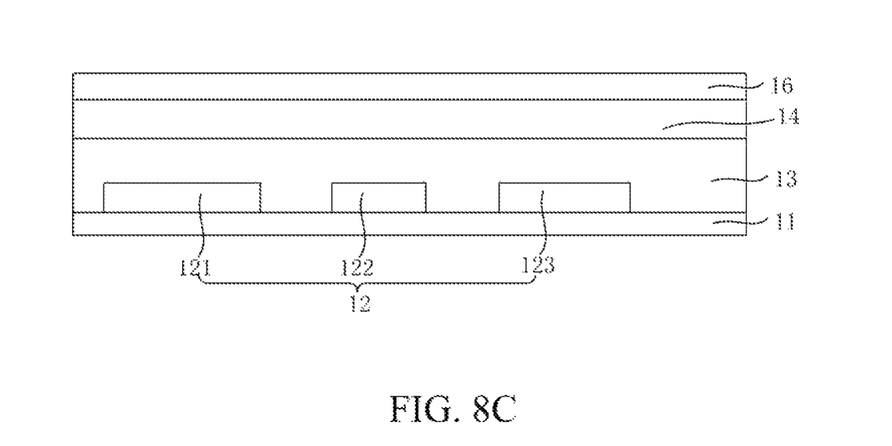

Specifically, please refer to FIG. 8C. The encapsulation layer 13 can be encapsulated by a thin film to prevent water vapor from intruding into the organic light-emitting layer of the light-emitting pixel unit 12 to cause the light-emitting pixel unit 12 to fail. The encapsulation layer 13 can be a single-layer encapsulation or a multi-layer encapsulation, Specifically, when the encapsulation layer 13 adopts multi-layer encapsulation, such as three-layer encapsulation, the encapsulation layer 13 includes a first inorganic encapsulation layer, an organic encapsulation layer, and a second inorganic encapsulation layer that are sequentially formed.

In step S30, a micro lens layer 14 is formed on a side of the light-emitting pixel unit 12 away from the array substrate 11, and the micro lens layer 14 includes a plurality of micro lenses 141 and a plurality of openings. The openings are formed between two adjacent micro lenses 141. The openings are arranged corresponding to the light-emitting pixel units 12.

Figure 8D:
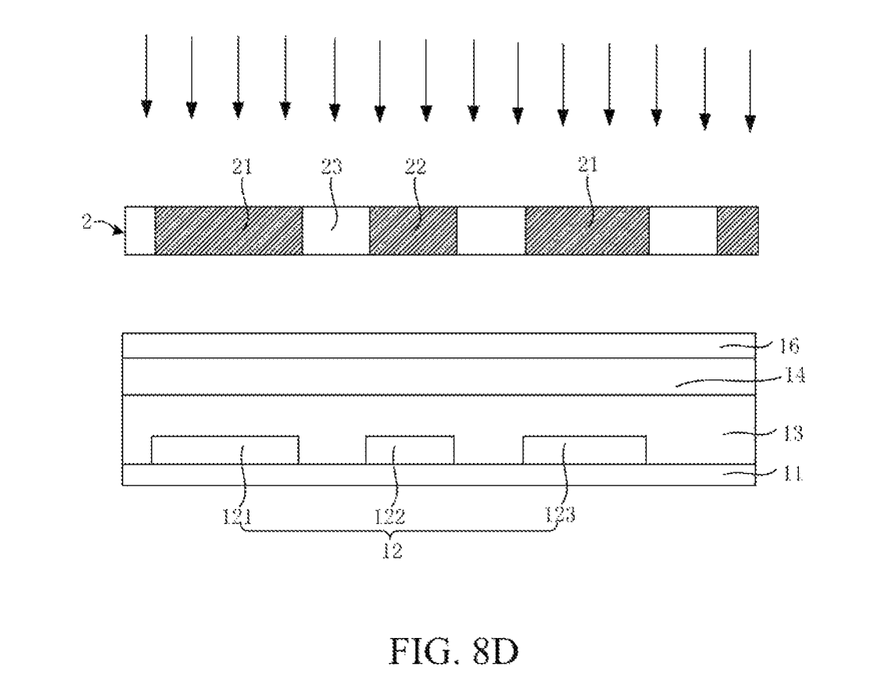
Figure 8E:
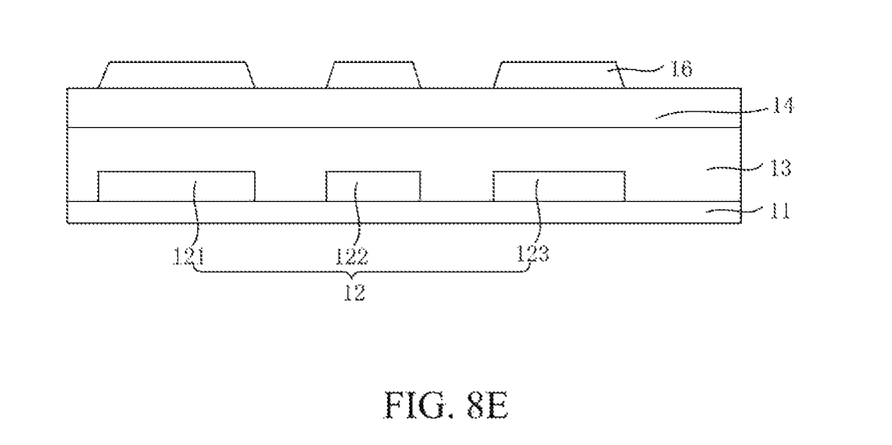
Figure 8F:
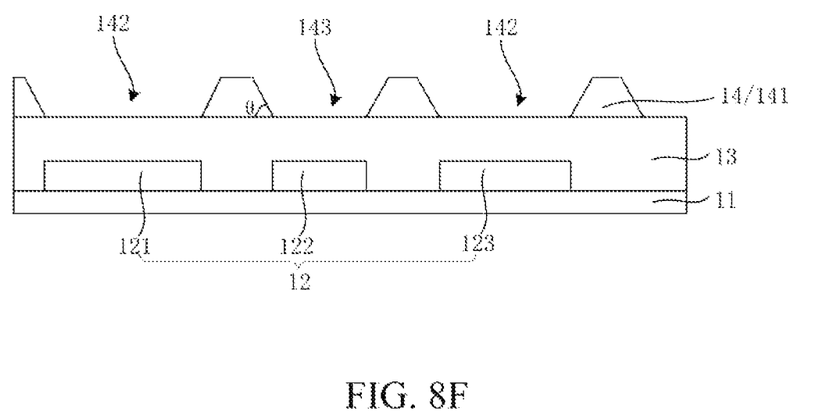

Specifically, refer to FIG. 8D. First, a micro lens layer 14 is formed on an entire surface of the encapsulation layer 13, and a photoresist layer 16 is formed on an entire surface of the micro lens layer 14. Please refer to FIG. 8E, and then the mask 2 is used to expose the photoresist layer 16 so that the photoresist layer 16 corresponding to the light-emitting pixel unit 12 is exposed. Referring to FIG. 8F, the photoresist layer 16 is stripped, and finally the micro lens layer 14 is etched with an etching solution, so that the micro lens layer 14 corresponding to the light-emitting pixel unit 12 is etched away. Thus, a plurality of the micro lenses 141 are formed, and the openings are formed between two adjacent micro lenses 141, and the plurality of openings include a plurality of first openings 142 and a plurality of second openings 143.

In step S40, a passivation layer 15 covering the encapsulation layer 13 and the micro lens layer 14 is formed.

Figure 8G:
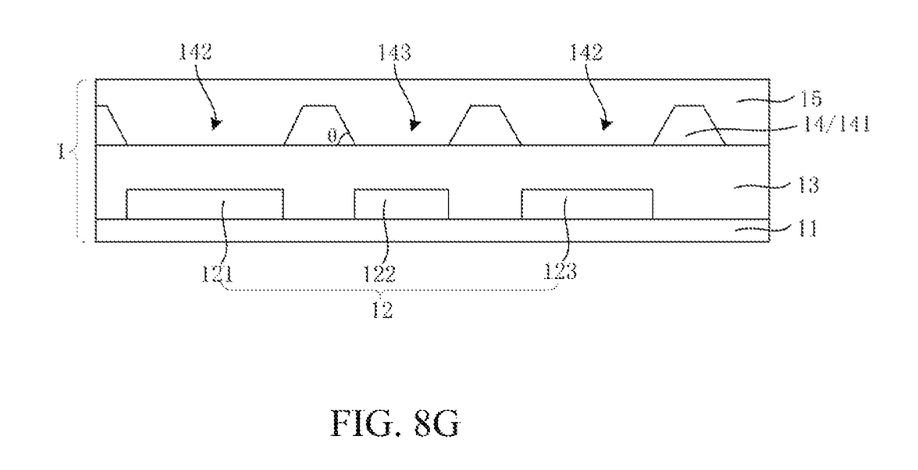

Specifically, please refer to FIG. 8G. The passivation layer 15 can be formed by a process of deposition, sputtering, or evaporation. The passivation layer 15 is an inorganic material. A refractive index of the passivation layer 15 is greater than a refractive index of the micro lens layer 14, so that the light emitted by the light-emitting pixel unit 12 converges at the boundary between the micro lenses 141 and the passivation layer 15. It is beneficial to improve the light extraction efficiency of the display panel 1.

In an embodiment, before forming the micro lens layer 14 on the encapsulation layer 13, the preparation method further includes the following steps: forming a touch layer on the encapsulation layer 13 (not shown in the figure). Specifically, the touch layer may adopt a DOT (Direct On Cell Touch, directly fabricating the touch layer on the encapsulation layer 13) structure, and the display panel 1 is a touch display panel.

It can be understood that the shape of the opening is the same as the shape of the corresponding light-emitting pixel unit 12 in the display panel 1 formed by using the above-mentioned mask plate 2. It is beneficial to improve the light condensing effect of the micro lenses 141, thereby improving the luminous efficiency of the display panel 1.

The present disclosure also provides a display device. The display device includes the display panel in the above embodiment. The display device can be any product or component with a display function, such as a mobile phone, a tablet computer, a television, a monitor, a notebook computer, a digital photo frame, a navigator, and the like.

The display device further includes a touch panel, which is combined with the display panel in a built-in or externally mounted manner, so that the display device has a touch function.

Beneficial effects are that: in the display panel and the display device provided in the present disclosure, the display panel includes a micro lens layer and a passivation layer, the micro lens layer includes a plurality of micro lenses and a plurality of openings, and the plurality of openings includes a plurality of first openings, where each of the first openings includes a main body. In the present disclosure, by setting an expansion portion at the corner to fine-tune a shape of the first opening based on a pattern of the main body portion. In one aspect, the first openings are made to be close to the light-emitting pixel unit in shape, so as to avoid reducing a light condensing effect of the micro lenses due to a large difference between the shape of the first openings and the light-emitting pixel units. In another aspect, forming a flared portion at the corner of the main body portion increases a distance between adjacent side edges, which can reduce a superimposed intensity of a diffracted light diffused into a mask at the corner, thereby improving the taper angle of the micro lenses. It is beneficial to improve a light condensing effect of the micro lenses, thereby improving a luminous efficiency of the display panel.

From above, although the present disclosure has been disclosed as above in preferred embodiments, the above-mentioned preferred embodiments are not intended to limit the present disclosure. Those of ordinary skill in the art can make various changes and modifications without departing from the spirit and scope of the present disclosure. Therefore, the protection scope of the present disclosure is subject to the scope defined by the claims.

The invention claimed is:

1. A display panel, comprising:
an array substrate;
a plurality of light-emitting pixel units arranged on the array substrate;
a micro lens layer arranged on a side of the light-emitting pixel units away from the array substrate, wherein the micro lens layer comprises a plurality of micro lenses and a plurality of openings, the openings are formed between two adjacent micro lenses, and the openings are arranged corresponding to the light-emitting pixel units;
a passivation layer covering the micro lens layer, wherein a refractive index of the passivation layer is greater than a refractive index of the micro lens layer; and
an encapsulation layer covering the light-emitting pixel units and the array substrate,
wherein the plurality of openings include a plurality of first openings, and in a direction along a plane of the display panel, each of the first openings includes a main body portion and at least one expansion portion, wherein the main body portion includes a plurality of side edges, and a corner is formed at the intersection of two adjacent side edges, wherein the expansion portion is arranged at the corner, and the expansion portion is an arc-shaped convex surface.

2. The display panel according to claim 1, wherein the plurality of side edges include a plurality of first sides and a plurality of second sides, and the first sides and two adjacent second sides respectively form a first corner and a second corner, wherein the expansion portion is provided at the first corner and the second corner.

3. The display panel according to claim 2, wherein the expansion portion surrounds the first corner and the second corner.

4. The display panel according to claim 2, wherein the expansion portion is located between two adjacent extension lines of the first side, and a circle where the expansion portion is located is circumscribed to a circle where the two adjacent first sides are located, respectively.

5. The display panel according to claim 2, wherein the expansion portion at least comprises a first sub-expansion portion and a second sub-expansion portion connected with each other, wherein the first sub-expansion portion surrounds the first corner, and the second sub-expansion portion surrounds the second corner.

6. The display panel according to claim 1, wherein a ratio of an area of the expansion portion to an area of the main body portion is less than or equal to 0.2.

7. The display panel according to claim 2, wherein an angle between a side surface of the micro lenses and a plane where the array substrate is located is in a range of 50 degrees to 90 degrees.

8. A display panel, comprising:
an array substrate;
a plurality of light-emitting pixel units arranged on the array substrate;
a micro lens layer arranged on a side of the light-emitting pixel units away from the array substrate, wherein the micro lens layer comprises a plurality of micro lenses and a plurality of openings, the openings are formed between two adjacent micro lenses, and the openings are arranged corresponding to the light-emitting pixel units; and
a passivation layer covering the micro lens layer, wherein a refractive index of the passivation layer is greater than a refractive index of the micro lens layer,
wherein the plurality of openings include a plurality of first openings, and in a direction along a plane of the display panel, each of the first openings includes a main body portion and at least one expansion portion, wherein the main body portion includes a plurality of side edges, and a corner is formed at the intersection of two adjacent side edges, wherein the expansion portion is arranged at the corner, and the expansion portion is an arc-shaped convex surface.

9. The display panel according to claim 8, wherein the plurality of side edges include a plurality of first sides and a plurality of second sides, and the first sides and two adjacent second sides respectively form a first corner and a second corner, wherein the expansion portion is provided at the first corner and the second corner.

10. The display panel according to claim 9, wherein the expansion portion surrounds the first corner and the second corner.

11. The display panel according to claim 9, wherein the expansion portion is located between two adjacent extension lines of the first side, and a circle where the expansion portion is located is circumscribed to a circle where the two adjacent first sides are located, respectively.

12. The display panel according to claim 9, wherein the expansion portion at least comprises a first sub-expansion portion and a second sub-expansion portion connected with each other, wherein the first sub-expansion portion surrounds the first corner, and the second sub-expansion portion surrounds the second corner.

13. The display panel according to claim 8, wherein a ratio of an area of the expansion portion to an area of the main body portion is less than or equal to 0.2.

14. The display panel according to claim 9, wherein an angle between a side surface of the micro lenses and a plane where the array substrate is located is in a range of 50 degrees to 90 degrees.

15. The display panel according to claim 14, wherein on a cross-section perpendicular to the two opposite first sides, an angle between the side surface of the micro lenses and the plane where the array substrate is located is a first angle; wherein on a cross-section perpendicular to the two opposite expansion portions, an angle between the side surface of the micro lenses and the plane where the array substrate is located is a second angle; and wherein, a range of a difference between the first angle and the second angle is less than 20 degrees.

16. The display panel according to claim 15, wherein the first angle and the second angle are equal.

17. The display panel according to claim 9, wherein the plurality of side edges include four first sides and four second sides, wherein the four first sides and the four second sides are alternately connected to form a closed figure, and the first sides are arc lines recessed toward an inside of the closed figure.

18. The display panel according to claim 17, wherein a planar shape of the main body portion is the same as a planar shape of corresponding light-emitting pixel units.

19. The display panel according to claim 8, wherein the openings further comprise a second opening, and a planar shape of the second opening is an ellipse or a circle; and the plurality of light-emitting pixel units at least include a red light-emitting pixel unit, a green light-emitting pixel unit, and a blue light-emitting pixel unit, wherein the first openings correspond to the red light-emitting pixel unit and the green light-emitting pixel unit, and the second opening corresponds to the blue light-emitting pixel unit.

20. A display device, comprising a display panel, wherein the display panel comprises:
an array substrate;
a plurality of light-emitting pixel units arranged on the array substrate;
a micro lens layer arranged on a side of the light-emitting pixel units away from the array substrate, wherein the micro lens layer comprises a plurality of micro lenses and a plurality of openings, the openings are formed between two adjacent micro lenses, and the openings are arranged corresponding to the light-emitting pixel units; and
a passivation layer covering the micro lens layer, wherein a refractive index of the passivation layer is greater than a refractive index of the micro lens layer,
wherein the plurality of openings include a plurality of first openings, and in a direction along a plane of the display panel, each of the first openings includes a main body portion and at least one expansion portion, wherein the main body portion includes a plurality of side edges, and a corner is formed at the intersection of two adjacent side edges, wherein the expansion portion is arranged at the corner, and the expansion portion is an arc-shaped convex surface.

* * * * *